(12) United States Patent
Yao et al.

(10) Patent No.: US 9,099,440 B2
(45) Date of Patent: Aug. 4, 2015

(54) MANUFACTURING METHOD OF ARRAY SUBSTRATE, ARRAY SUBSTRATE AND DISPLAY (71) Applicant: BOE TECHNOLOGY GROUP CO., LTD., Beijing (CN)

(72) Inventors: Qi Yao, Beijing (CN); Tianming Dai, Beijing (CN); Feng Zhang, Beijing (CN); Zhanfeng Cao, Beijing (CN); Peiyu Zhu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 13/991,371

(22) PCT Filed: Nov. 21, 2012

(86) PCT No.: PCT/CN2012/084966
§ 371 (c)(1),
(2) Date: Jun. 3, 2013

(87) PCT Pub. No.: WO2013/127202
PCT Pub. Date: Sep. 6, 2013

(65) Prior Publication Data
US 2014/0054586 A1 Feb. 27, 2014

(30) Foreign Application Priority Data
Feb. 28, 2012 (CN) .......................... 2012 1 0048821

(51) Int. Cl.
H01L 21/00 (2006.01)
H01L 21/467 (2006.01)
(Continued)

(52) U.S. Cl.
CPC .......... *H01L 21/467* (2013.01); *H01L 27/1214* (2013.01); *H01L 27/1259* (2013.01);
(Continued)

(58) Field of Classification Search
CPC ..................... H01L 29/7869; H01L 29/78693; H01L 21/02554

USPC ................................ 257/43, 59, 72; 438/104
See application file for complete search history.

(56) References Cited

U.S. PATENT DOCUMENTS

2004/0242000 A1 12/2004 Jo et al.
2005/0077521 A1 4/2005 Yoo et al.
(Continued)

FOREIGN PATENT DOCUMENTS

CN 1417383 A 5/2003
CN 101098989 A 1/2008
(Continued)

OTHER PUBLICATIONS

First Chinese Office Action dated Sep. 17, 2013; Appln. No. 201210046821.3.
(Continued)

*Primary Examiner* — Tan N Tran
(74) *Attorney, Agent, or Firm* — Ladas & Parry LLP (57) ABSTRACT Embodiments of the present invention disclose a manufacturing method of an array substrate, an array substrate and a display. The manufacturing method comprises: forming a gate electrode of a TFT on a substrate; forming a metal oxide semiconductor thin film and a top metal thin film, and performing a mask process to the metal oxide semiconductor thin film and the top metal thin film, in order to form an active layer opposing the gate electrode and a source electrode and a drain electrode of the TFT respectively; and forming a passivation layer overlying the source electrode and the drain electrode, wherein during the mask process to the top metal thin film, a hydrogen peroxide-based etchant with a pH value between 6 and 8 is used to etch the top metal thin film.

14 Claims, 5 Drawing Sheets (51) Int. Cl.
*H01L 27/12* (2006.01)
*H01L 29/786* (2006.01)
*H01L 29/66* (2006.01)
*H01L 29/45* (2006.01)

(52) U.S. Cl.
CPC .......... *H01L29/45* (2013.01); *H01L 29/66969* (2013.01); *H01L 29/7869* (2013.01); *H01L 29/78606* (2013.01)

(56) References Cited

U.S. PATENT DOCUMENTS

| | | |
|---|---|---|
| 2008/0286701 A1 | 11/2008 | Rath et al. |
| 2008/0318368 A1 | 12/2008 | Ryu et al. |
| 2010/0029088 A1 | 2/2010 | Mayer et al. |
| 2010/0065841 A1 | 3/2010 | Lee et al. |
| 2010/0193784 A1* | 8/2010 | Morosawa et al. ............. 257/43 |
| 2010/0301328 A1 | 12/2010 | Yamazaki et al. |
| 2010/0308324 A1* | 12/2010 | Kim et al. .................. 257/43 |
| 2010/0320457 A1 | 12/2010 | Matsubara et al. |
| 2011/0114942 A1 | 5/2011 | Akimoto et al. |
| 2011/0149185 A1 | 6/2011 | Yamazaki |
| 2011/0233542 A1 | 9/2011 | Yamazaki et al. |
| 2012/0007086 A1 | 1/2012 | Oh et al. |
| 2012/0045904 A1 | 2/2012 | Choi |
| 2012/0146029 A1* | 6/2012 | Choi et al. .................. 257/59 |

FOREIGN PATENT DOCUMENTS

| | | |
|---|---|---|
| CN | 101901839 A | 12/2010 |
| CN | 102629591 A | 8/2012 |
| EP | 2234145 A1 | 9/2010 |
| JP | 2004-031791 * | 1/2004 |
| JP | 2011-124561 A | 6/2011 |
| KR | 20050034926 A | 4/2005 |
| KR | 20100098409 A | 9/2010 |
| KR | 20110009834 A | 1/2011 |
| TW | 201115650 A | 5/2011 |
| WO | 2012/024114 A2 | 2/2012 |

OTHER PUBLICATIONS

Second Chinese Office Action dated May 9, 2014; Appln. No. 201210048821.3.
Korean Office Action dated Mar. 25, 2014; Appln. No. 10-2013-7012238.
International Search Report mailed Feb. 28, 2013; PCT/CN2012/084966.
Third Chinese Office Action Appln. No. 201210048821.3; Dated Oct. 30, 2014.
Korean Office Action Appln. No. 10-2013-7012238; Dated Nov. 27, 2014.
Korean Office Action Appln. No. 10-2013-7012238; Dated Sep. 23, 2014.
International Preliminary Report on Patentability Appln. No. PCT/CN2012/084966; Dated Sep. 2, 2014.
Partial Supplementary European Search Report Appln. No. 12844653.1-1504; Dated Feb. 5, 2015.
Fourth Chinese Office Action Appln. No. 201210048621.3, Dated Apr. 7, 2015.
Extended European Search Report Appln. No. 12844653.1—1504/2822030 PCT/CN2012084866; Dated May 26, 2015.

* cited by examiner

Fig. 7

MANUFACTURING METHOD OF ARRAY SUBSTRATE, ARRAY SUBSTRATE AND DISPLAY

TECHNICAL FIELD

Embodiments of the invention relate to a manufacturing method of an array substrate, an array substrate and a display.

BACKGROUND

With the rapid development of display technology, there are increasingly high requirements for display performance or characteristics such as display resolution and response time. In this case, with the development of 3D display technologies and as the size of a display is increasing, there are increasingly high requirements for mobility of thin film transistor (TFT) provided in an array substrate of a display.

The TFT comprises: a gate electrode, a gate insulating layer, an active layer, a source electrode and a drain electrode. The aforementioned mobility of TFT actually refers to the average drift velocity of carriers (electrons and holes) in the active layer of the TFT under per unit electric field. At present, active layers made of amorphous silicon can no longer meet the requirements for mobility, while metal oxide materials with higher mobility are attracting more attention. The manufacturing process of TFT in conventional techniques which uses metal oxide as active layer material has the following problem: mask process performed on source/drain electrode in conventional process is to use acid to etch patterns, but the metal oxide material is generally not acid-proof, therefore, conventional process will corrode part of the active layer which affects the performance of the device. To solve this problem, an etching stopper layer which is acid-resistant is usually used to cover the channel region of the active layer to protect the active layer from being corroded. However, it adds one more mask process, which makes the mask process complicated.

SUMMARY

According to an embodiment of the present invention, there is provided a manufacturing method of an array substrate, comprising: forming an underlying metal thin film on a substrate, and forming at least a gate electrode of a TFT by a mask process; forming a gate insulating layer overlying the gate electrode; forming a metal oxide semiconductor thin film and a top metal thin film, and performing a mask process to the metal oxide semiconductor thin film and the top metal thin film, to form a source electrode and a drain electrode of the TFT and an active layer opposing the gate electrode respectively; and forming a passivation layer overlying the source electrode and the drain electrode, and forming a contact hole at the position of the drain electrode which connects a pixel electrode, wherein during the mask process to the top metal thin film, hydrogen peroxide-based etchant with a pH value between 6 and 8 is used to etch the top metal thin film.

According to another embodiment of the present invention, there is provided an array substrate, comprising pixel units disposed on a substrate in the form of array, and each pixel unit comprising: a TFT and a passivation layer overlying the TFT, wherein the TFT comprises a gate electrode, a gate insulating layer, an active layer of metal oxide semiconductor material, a source electrode/a drain electrode sequentially disposed in this order; a first isolation layer is disposed between the gate insulating layer and the active layer, which is used to prevent the gate insulating layer from contacting the active layer; and the material of the first isolation layer is non-metal oxide material without hydrogen.

According to still another embodiment of the present invention, there is provided a display, comprising the array substrate provided in embodiments of the present invention.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DETAILED DESCRIPTION

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

First Embodiment

Figure 1:
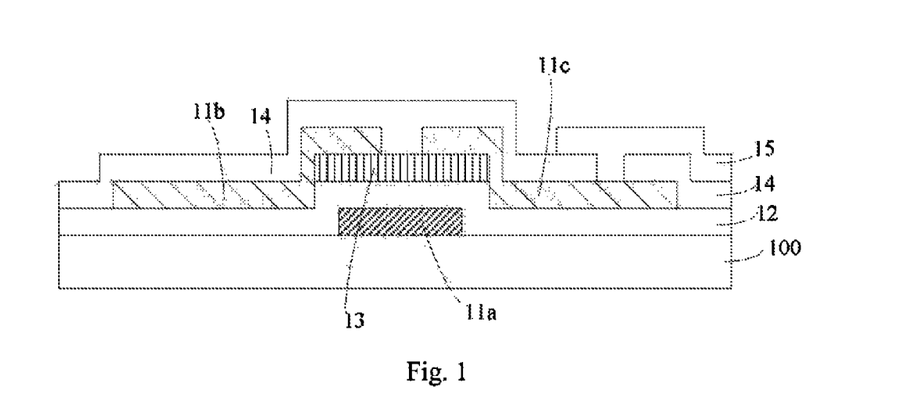
FIG. 1 illustrates a schematic diagram of a structure of an array substrate provided in the first embodiment.

According to the structural diagram of an array substrate as shown in FIG. 1, the array substrate comprises: pixel units disposed on the substrate 100 in the form of array, each pixel unit comprising: a TFT, a passivation layer 14 overlying the TFT and a pixel electrode 15 disposed horizontally relative to the TFT. The TFT comprises: a gate electrode 11a, a gate insulating layer 12, an active layer 13 of metal oxide semiconductor material, and a source electrode 11b/a drain electrode 11c sequentially disposed in this order; and the drain electrode 11c of the TFT is connected with the pixel electrode 15 through a contact hole in the passivation layer 14.

Since conventional manufacturing process results in corroding the active layer of metal oxide semiconductor material, embodiments of the present invention provide a manufacturing method of the above array substrate structure, in order to protect the active layer.

Referring to FIG. 1, the manufacturing method of an array substrate provided in embodiments of the present invention comprises:

S101: forming an underlying metal thin film on the substrate 100, and forming at least a gate electrode 11a of a TFT by one mask process;

the material of the underlying metal thin film can be metal such as molybdenum, aluminum, copper or chromium, or alloy containing these metals.

In all embodiments of the present invention, the mask process can comprise: applying photoresist, exposing, developing, etching etc. The exposing process needs a mask plate to control the exposure of the photoresist in different regions. During the whole manufacturing process of the array substrate, the number of mask plates used is usually used as the times of mask process; that is to say, performing mask process one time is using a mask plate one time to finish patterning.

S102: forming a gate insulating layer 12 overlying the gate electrode;

the material of the gate insulating layer 12 can be SiNx (silicon nitride) material that is normally used.

S103: forming a metal oxide semiconductor thin film, and forming an active layer 13 at the position where opposes the gate electrode 11a by one mask process;

the material of the metal oxide semiconductor can be any metal oxide that can be used as a semiconductor, such as IGZO (metal oxide containing indium, gallium, and zinc), IZO (metal oxide containing indium and zinc), etc.

S104: forming a top metal thin film, and forming at least a source electrode 11b and a drain electrode 11c of the TFT by one mask process; the composition of the etchant used in this mask process comprises: hydrogen peroxide, top metal ion complexing agent, stabilizing agent of hydrogen peroxide, and surfactant; and the pH value of the etchant is between 6 and 8;

the material of the top metal thin film can be metal such as molybdenum, aluminum, copper or chromium, or alloy containing at least one of these metals. In embodiments of the present invention, high requirements for display resolution and switch delay characteristics are taking into account; because the resistance of copper is low, it makes a short charging time, and a source/drain electrode made of copper can give smaller pixel size, i.e. an increase in the pixel number per unit area, which can improve the resolution of the display. Therefore, copper or copper alloy is preferably used as the material of the top metal thin film in the present embodiment. The top metal complexing agent in embodiments of the present invention refers to compound capable of forming complex ions with top metal ions. In embodiments of the present invention, when top metal is copper or copper alloy, top metal ion complexing agent is copper ion complexing agent.

In addition, according to empirical value from many experiments, in embodiments of the present invention, for the composition of the hydrogen peroxide-based etchant, the content of the hydrogen peroxide may be, for example, 5%-20%, the content of the surfactant may be, for example, 1%-10%, the content of the top metal ion complexing agent is determined based on the amount of the top metal that is needed to be etched off, and generally, the content of the top metal ion complexing agent is 1%-25%. Specifically, the control of the content of the top metal complexing agent may be as follows: part (such as the content is 50%) of top metal complexing agent may firstly be added into the etchant, and then the top metal complex ions is continually added according to the content of the top metal ions that has dissolved into the etchant and according to the completion of etching to the top metal thin film. Top metal ion complexing agent can select any proper complexing agent according to the material of the top metal thin film; the stabilizing agent of hydrogen peroxide and the surfactant can also choose any suitable reagent and will not be described here.

S105: forming a passivation layer 14 overlying the source electrode and drain electrode, and forming a contact hole that connects the pixel electrode 15 at the position of the drain electrode 11c by one mask process.

The material of the passivation layer 14 may be SiNx (silicon nitride) material that is normally used.

The method of manufacturing array substrate as shown in FIG. 1 can further comprise S106.

S106: forming a transparent conductive thin film overlying the contact hole in S105, and forming the pixel electrode 15 by one mask process.

The material of the transparent conductive thin film may be ITO (indium tin oxide) that is normally used.

In the manufacturing method of an array substrate provided in embodiments of the present invention, top metal thin film is etched by hydrogen peroxide-based etchant with a pH value between 6 and 8, which enables the hydrogen peroxide-based etchant to perform a mask process to the top metal thin film by way of oxidation and complexing; and oxides in the etchant do not react with the metal oxide semiconductor below, which does not change the semiconductor characteristics of the metal oxide.

In conventional techniques, a gate insulating layer is generally manufactured by the method of chemical vapor deposition using gases such as silicane, which makes the resultant gate insulating layer contain H element. To prevent the H element of the gate insulating layer from entering into the active layer of metal oxide semiconductor material, the array substrate shown in FIG. 2 comprises: pixel units disposed on the substrate 100 in the form of array, each pixel unit comprising: a TFT and a passivation layer 14 overlying the TFT. The TFT comprises: a gate electrode 11a, a gate insulating layer 12, an active layer 13 of metal oxide semiconductor material, and a source electrode 11b/a drain electrode 11c sequentially disposed in this order. A first isolation layer 21 is disposed between the gate insulating layer 12 and the active layer 13, which is used to prevent the gate insulating layer 12 from contacting the active layer 13. The material of the first isolation layer 21 is non-metal oxide material containing no hydrogen.

In all embodiments of the present invention, the non-metal oxide material without hydrogen may be material such as $SiO_2$ (silicon oxide).

Figure 2:
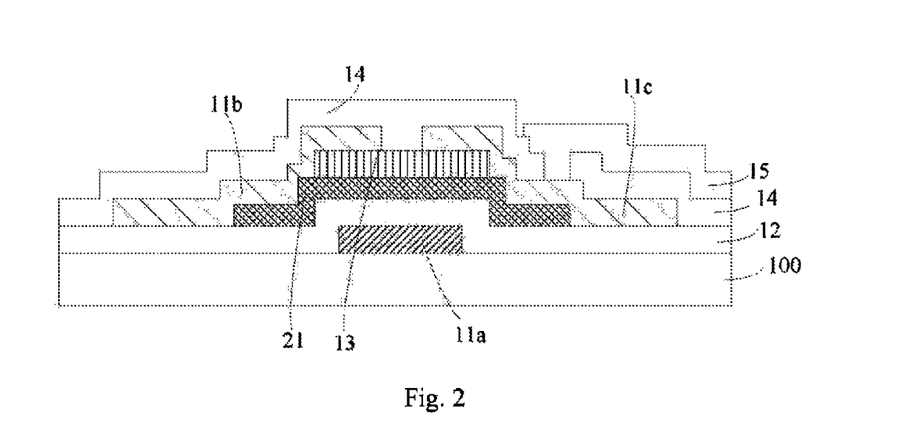
FIG. 2 illustrates a schematic diagram of a structure of another array substrate provided in the first embodiment.

To manufacture the array substrate as shown in FIG. 2, the manufacturing method of the array substrate as shown in FIG. 1 needs to further comprise S102a between the step S102 and S103;

S102a: forming a non-metal oxide film without hydrogen, and forming a first isolation layer 21 at a position where opposes the gate electrode 11a by one mask process, the first isolation layer 21 being used to prevent the gate insulating layer 12 from contacting the active layer 13.

For example, depositing non-metal oxide material without hydrogen on the substrate formed with the gate insulating layer 12, in order to form a thin film; and forming a pattern at a position where opposes the gate electrode 11a, which is larger than the peripheral edge of the active layer 13, to prevent the gate insulating layer 12 from contacting the active layer 13. In this way, the H element in the gate insulating layer 12 is effectively prevented from entering into the metal oxide semiconductor material, thereby protecting the active layer 13, avoiding the deterioration of characteristics of the TFT, and improving the response time of the TFT.

Similar to the manufacturing of the gate insulating layer, in conventional techniques, a passivation layer is generally manufactured by the method of chemical vapor deposition using gases such as silicane, which makes the resultant passivation layer contain the H element. Therefore, to prevent H element in the passivation layer 14 from entering into the active layer 13 of metal oxide semiconductor material, referring to FIG. 3, the array substrate shown in FIG. 2 may further comprises: a second isolation layer 22 disposed between the TFT and the passivation layer 14 overlying the TFT, which is used to prevent the active layer 13 of the TFT from contacting the passivation layer 14; and the material of the second isolation layer 22 is non-metal oxide material without hydrogen.

Figure 3:
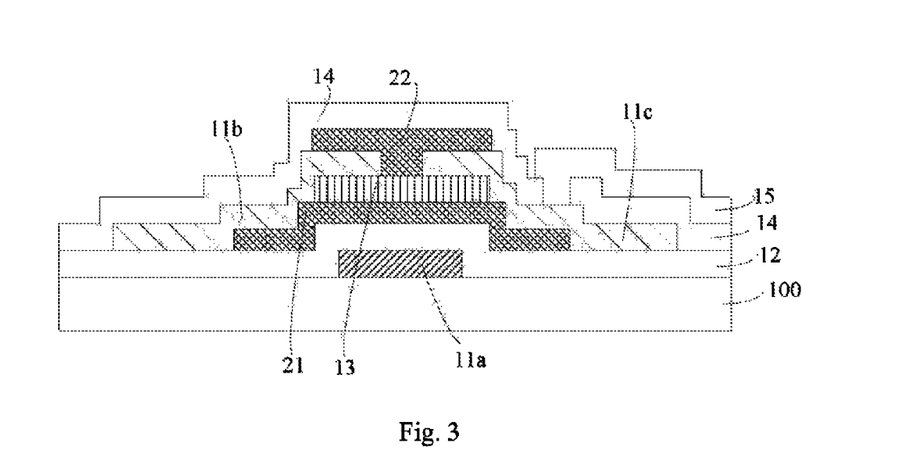
FIG. 3 illustrates a schematic diagram of a structure of still another array substrate provided in the first embodiment.

To manufacture the array substrate as shown in FIG. 3, the manufacturing method of the array substrate as shown in FIG. 2 needs to further comprise S104a between the step S104 and S105;

S104a: forming a non-metal oxide film without hydrogen, and forming a second isolation layer 22 at the position where opposes the gate electrode 11a by one mask process, the second isolation layer 22 being used to prevent the active layer 13 from contacting the passivation layer 14.

For example, depositing non-metal oxide material without hydrogen on the substrate formed with the source electrode and drain electrode 11e, in order to form a thin film; and forming a pattern opposing the gate electrode 11a, which can cover the channel region (i.e. the region of the active layer 13 which is not covered by the source electrode and drain electrode) of the active layer 13, to prevent the passivation layer 14 from contacting the active layer 13. In this way, the H element in the passivation layer 14 is effectively prevented from entering into the metal oxide semiconductor material, thereby protecting the active layer 13, avoiding the deterioration of characteristics of the TFT, and improving the response time of the TFT.

It should be noted that the pattern of the second isolation layer 22 can be the same as the pattern of the channel region of the active layer 13, and can be slightly larger than the pattern of the channel region. If the pattern of the second isolation layer 22 is large enough to cover not only the channel region but also the whole pattern of the drain electrode, when forming the contact hole in S105, the passivation layer and the second isolation layer are both needed to be etched through to enable the contact between the drain electrode and the pixel electrode.

Second Embodiment

Figure 4:
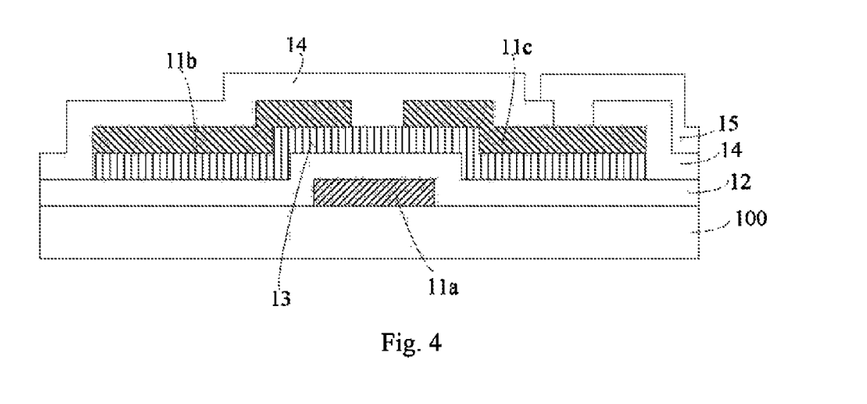
FIG. 4 illustrates a schematic diagram of a structure of an array substrate provided in the second embodiment.

Referring to the structural diagram of an array substrate as shown in FIG. 4, this array substrate comprises: pixel units disposed on the substrate 100 in the form of array, each pixel unit comprising: a TFT, a passivation layer 14 overlying the TFT, and a pixel electrode 15. The TFT comprises: a gate electrode 11a, a gate insulating layer 12, an active layer 13 of metal oxide semiconductor material, and a source electrode 11b/a drain electrode 11c sequentially disposed in this order; and the drain electrode 11c of the TFT is connected with the pixel electrode 15 through a contact hole in the passivation layer 14. The active layer 13, the source electrode 11b and the drain electrode 11c are formed in the same layer by a mask process.

It should be noted that the manufacturing material of each layer in this embodiment can be referred to those of the first embodiment, which will not be described in this embodiment.

Figure 5A:
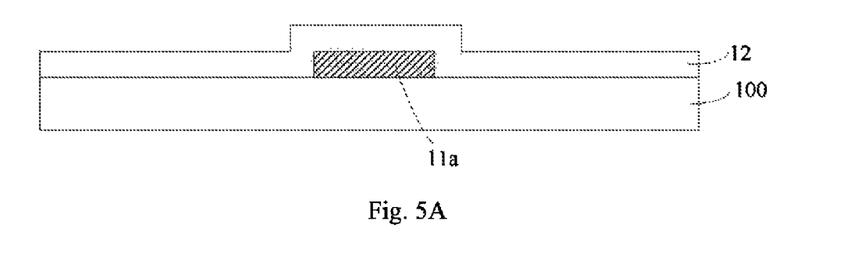
FIG. 5A-FIG. 5G schematically illustrate steps for manufacturing the array substrate as shown in FIG. 4.

The manufacturing method of the above array substrate provided in the embodiment of the present invention comprises:

S201: forming an underlying metal thin film on the substrate 100, and forming at least a gate electrode 11a of a TFT by one mask process;

S202: forming a gate insulating layer 12 overlying the gate electrode, referring to the structure as shown in FIG. 5A.

Figure 5B:
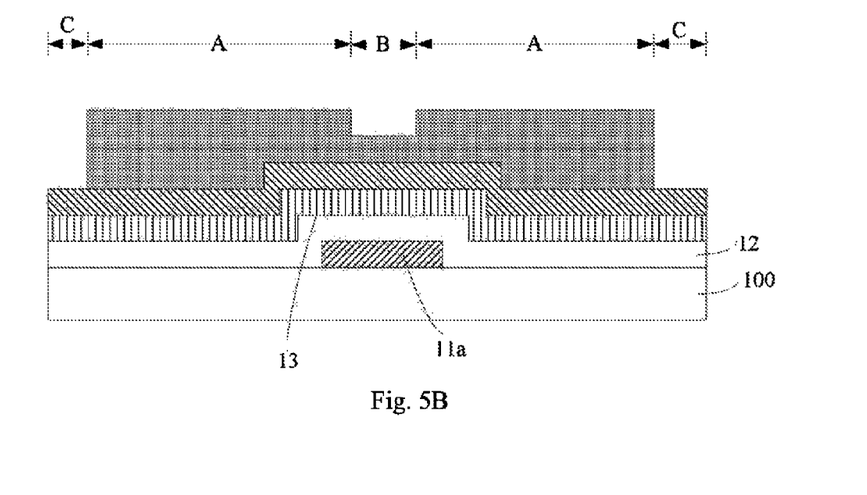
Figure 5C:
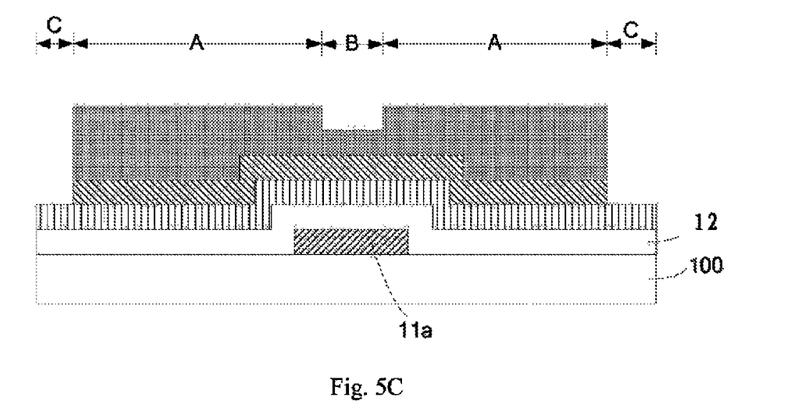
Figure 5D:
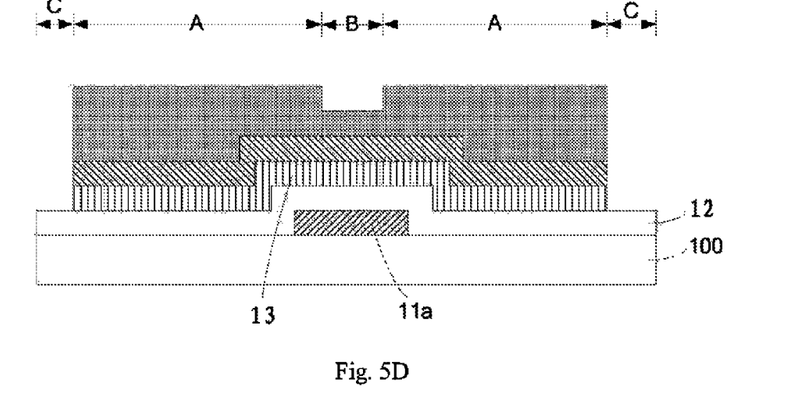
Figure 5E:
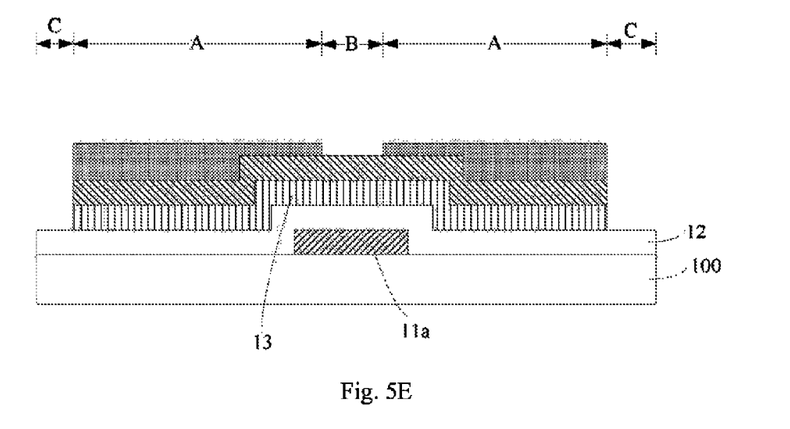
Figure 5F:
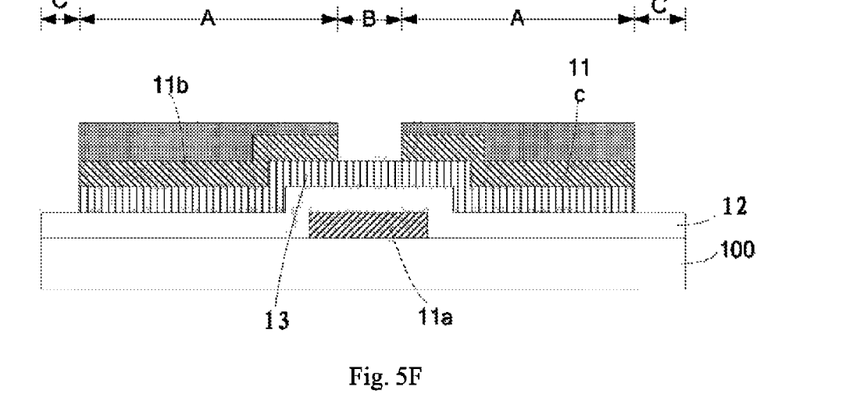
Figure 5G:
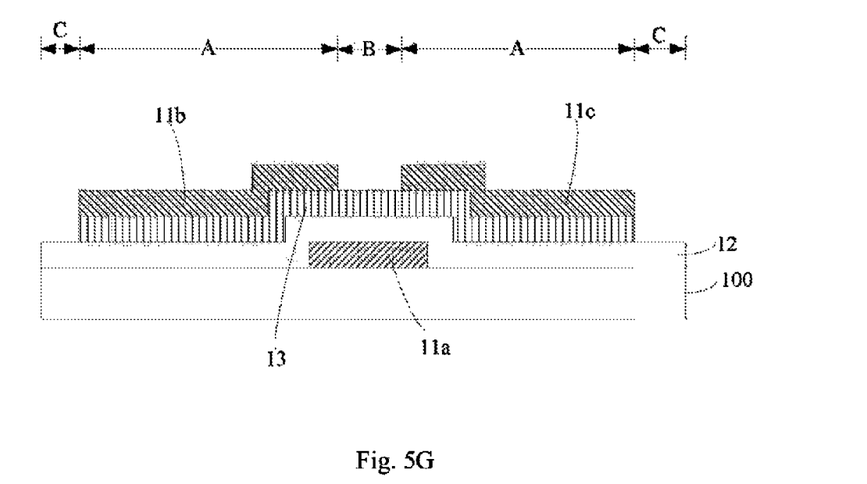

S203: forming a metal oxide semiconductor thin film and a top metal thin film sequentially, and forming at least an active layer 13, a source electrode 11b and a drain electrode 11c by one mask process;

this step may comprise: applying photoresist to the sequentially formed two thin films, the photoresist being formed into a partially remained region (which is identified as B in the figures), a completely remained region (which is identified as A in the figures) and a completely removed region (which is identified as C in the figures), and according to the above divided regions, by a single exposure and development, removing photoresist in the completely removed region and having photoresist in the completely remained region remain thicker than that in the partially remained region, as shown in FIG. 5B; etching the top metal thin film in the completely removed region with hydrogen peroxide-based etchant, as shown in FIG. 5C; etching the metal oxide film in the completely removed region with acid etchant that does not react with the top metal, so as to form an active layer 13, as shown in FIG. 5D; ashing photoresist that is left, in order to remove photoresist in the partially remained region and have part of photoresist in the completely remained region remain, as shown in FIG. 5E; etching top metal thin film in the partially remained region with the hydrogen peroxide-based etchant, so as to form a source electrode and a drain electrode 11c, as shown in FIG. 5F; removing photoresist that is left, as shown in FIG. 5G;

wherein the composition of the hydrogen peroxide-based etchant comprises: hydrogen peroxide, top metal ion complexing agent, stabilizing agent of hydrogen peroxide, and surfactant; and the pH value of the etchant is between 6 and 8; the content of the hydrogen peroxide is, for example, 5%-20%, the content of the surfactant is, for example, 1%-10%, the content of the top metal ion complexing agent is, for example, 1%-25%.

In addition, the top metal is, for example, copper or copper alloy.

S204: forming a passivation layer 14 overlying the source and drain electrodes, and forming a contact hole that connects the pixel electrode at the position of the drain electrode.

The method that forms the array substrate as shown in FIG. 4 may further comprise S205.

S205: forming a transparent conductive thin film covering the contact hole in S105, and forming a pixel electrode 15 by one mask process.

The material of the transparent conductive thin film may be ITO (indium tin oxide) that is normally used.

In the manufacturing method of an array substrate provided in embodiments of the present invention, top metal thin film is etched by hydrogen peroxide-based etchant with a pH value between 6 and 8, which enables the hydrogen peroxide-based etchant to perform mask processes to the top metal thin film by way of oxidation and complexing; and oxides in the etchant do not react with the metal oxide semiconductor below, which does not change the semiconductor characteristics of metal oxide.

Figure 6:
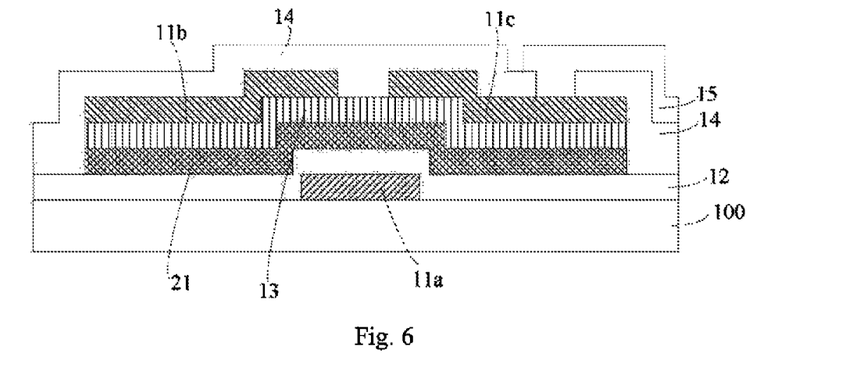
FIG. 6 illustrates a schematic diagram of a structure of another array substrate provided in the second embodiment.

Further, to prevent the H element of the gate insulating layer 12 from entering into the active layer 13 of metal oxide semiconductor material, referring to FIG. 6, the array substrate comprises: pixel units disposed on the substrate 100 in the form of array, each pixel unit comprising: a TFT and a passivation layer 14 overlying the TFT; the TFT comprises: a gate electrode 11a, a gate insulating layer 12, an active layer 13 of metal oxide semiconductor material, a source electrode 11b and a drain electrode 11c sequentially disposed in this order; a first isolation layer 21 is disposed between the gate insulating layer 12 and the active layer 13, which is used to prevent the gate insulating layer 12 from contacting the active layer 13; and the material of the first isolation layer 21 is non-metal oxide material without hydrogen.

To manufacture the array substrate as shown in FIG. 6, the manufacturing method of the array substrate as shown in FIG. 4 needs to further comprise S202a between the step S202 and S203;

S202a: forming a non-metal oxide film without hydrogen, and forming a first isolation layer 21 at the position where opposes the gate electrode 11a by one mask process, the first isolation layer 21 being used to prevent the gate insulating layer 12 from contacting the active layer 13.

More details can refer to S102a in the first embodiment.

Figure 7:
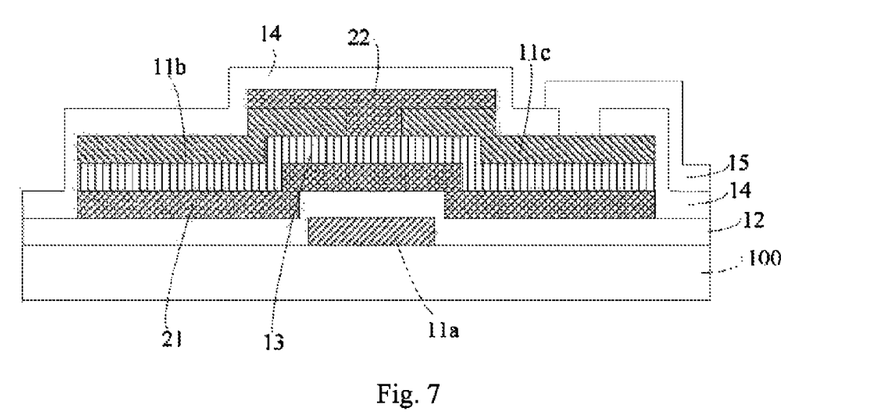
FIG. 7 illustrates a schematic diagram of a structure of still another array substrate provided in the second embodiment.

Further, to prevent the H element of the passivation layer 14 from entering into the active layer 13 of metal oxide semiconductor material, referring to FIG. 7, the array substrate as shown in FIG. 6 further comprises: a second isolation layer 22 disposed between the TFT and the passivation layer 14 overlying the TFT, which is used to prevent the active layer 13 of the TFT from contacting the passivation layer 14; and the material of the second isolation layer 22 is non-metal oxide material without hydrogen.

To manufacture the array substrate as shown in FIG. 7, the manufacturing method of the array substrate as shown in FIG. 6 needs to further comprise S203a between the step S203 and S204;

S203a: forming a non-metal oxide film without hydrogen, and forming a second isolation layer 22 at the position where opposes the gate electrode 11a by one mask process, the second isolation layer 22 being used to prevent the active layer 13 from contacting the passivation layer 14.

This step can refer to S104a.

It should be noted that the pattern of the second isolation layer 22 can be the same as the pattern of the channel region of the active layer 13, and can be slightly larger than the pattern of the channel region; if the pattern of the second isolation layer 22 is large enough to cover not only the channel region but also the whole pattern of the drain electrode, when forming the contact hole in S204, the passivation layer and the second isolation layer are both needed to be etched through to enable the contact between the drain electrode and the pixel electrode.

Embodiments of the present invention effectively prevent H element of the gate insulating layer 12 from entering into the metal oxide semiconductor material by using the first isolation layer 21, and effectively prevent H element of the passivation layer 14 from entering into the metal oxide semiconductor material by using the second isolation layer 22, thus further protecting the active layer 13 from being corroded.

According to an embodiment of the present invention, there is provided a display, which may comprise any array substrate of the above first embodiment or second embodiment. For example, the display may be liquid crystal display.

In the manufacturing method of an array substrate provided in embodiments of the present invention, and for the array substrate and display provided in embodiments of the present invention, top metal thin film is etched by hydrogen peroxide-based etchant with a pH value between 6 and 8, which ensures that the hydrogen peroxide-based etchant do not react with the metal oxide semiconductor, thereby protecting the active layer of the TFT from being corroded; and furthermore, in conventional techniques, material of the gate insulating layer has Hydrogen (H) element, to avoid H element entering into the active layer which causes characteristics deterioration of the active layer, the first isolation layer is manufactured with non-metal oxide material without hydrogen which can prevent the occurrence of the above-described characteristics deterioration and may further protect the active layer.

According to embodiments of the present invention, there are provided at least the following structures and methods:

(1) a manufacturing method of an array substrate, comprising:

forming an underlying metal thin film on a substrate, and forming at least a gate electrode of a TFT by a mask process;

forming a gate insulating layer overlying the gate electrode;

forming a metal oxide semiconductor thin film and a top metal thin film, and performing a mask process to the metal oxide semiconductor thin film and the top metal thin film, to form a source electrode and drain electrode of the TFT and an active layer opposing the gate electrode respectively; and forming a passivation layer overlying the source electrode and drain electrode, and forming a contact hole at the position of the drain electrode which connects the pixel electrode, wherein during the mask process to the top metal thin film, a hydrogen peroxide-based etchant with pH value between 6 and 8 is used to etch the top metal thin film.

(2) According to the manufacturing method as described in (1), the composition of the hydrogen peroxide-based etchant comprises: hydrogen peroxide, top metal ion complexing agent, stabilizing agent of the hydrogen peroxide, and surfactant.

(3) According to the manufacturing method as described in (1) or (2), in the etchant, the content of the hydrogen peroxide is 5%-20%, the content of the surfactant is 1%-10%, and the content of the top metal ion complexing agent is 1%-25%.

(4) According to the manufacturing method as described in (1), (2) or (3), after forming the gate insulating layer and before forming the metal oxide semiconductor thin film, the method further comprises:

forming a non-metal oxide film without hydrogen, and forming a first isolation layer at the position where opposes the gate electrode by one mask process, the first isolation layer being used to prevent the gate insulating layer from contacting the active layer.

(5) According to the manufacturing method as described in any one of (1)-(4), after forming the source electrode and drain electrode of the TFT, and before forming the passivation layer, the method further comprises:

forming a non-metal oxide film without hydrogen, and forming a second isolation layer at the position where opposes the gate electrode by one mask process, the second isolation layer being used to prevent the active layer from contacting the passivation layer.

(6) According to the manufacturing method as described in any one of (1)-(5), the top metal is copper or copper alloy.

(7) According to the manufacturing method as described in any one of (1)-(6), the step of forming a source electrode and drain electrode of the TFT and an active layer opposing the gate electrode comprises:

forming the metal oxide semiconductor thin film, and forming the active layer at the position where opposes the gate electrode by one mask process; and forming the top metal thin film, and forming at least the source electrode and drain electrode of the TFT by one mask process.

(8) According to the manufacturing method as described in any one of (1)-(6), the step of forming a source electrode and drain electrode of the TFT and an active layer opposing the gate electrode comprises:

forming sequentially the metal oxide semiconductor thin film and the top metal thin film;

applying photoresist to the sequentially formed two thin films, the photoresist being formed into a partially remained region, a completely remained region and a completely removed region, and according to the above divided regions, by a single exposure and development, removing photoresist in the completely removed region and having photoresist in the completely remained region remain thicker than that in the partially remained region;

etching the top metal thin film in the completely removed region with the hydrogen peroxide-based etchant;

etching the metal oxide film in the completely removed region with acid etchant that does not react with the top metal, so as to form an active layer;

ashing photoresist that is left, in order to remove photoresist in the partially remained region and have part of photoresist in the completely remained region remain; and etching top metal thin film in the partially remained region with the hydrogen peroxide-based etchant, so as to form a source electrode and drain electrode.

(9) According to the manufacturing method as described in (6), the top metal ion complexing agent is copper ion complexing agent.

(10) An array substrate, comprising: pixel units disposed on the substrate in the form of array, each pixel unit comprising: a TFT and a passivation layer overlying the TFT;

the TFT comprises: a gate electrode, a gate insulating layer, an active layer of metal oxide semiconductor material, and a source electrode/a drain electrode sequentially disposed in this order; and a first isolation layer is disposed between the gate insulating layer and the active layer, which is used to prevent the gate insulating layer from contacting the active layer; the material of the first isolation layer is non-metal oxide material without hydrogen.

(11) The array substrate according to (10), wherein a second isolation layer is disposed between the TFT and the passivation layer overlying the TFT, which is used to prevent the active layer of the TFT from contacting the passivation layer; and the material of the second isolation layer is non-metal oxide material without hydrogen.

(12) A display, comprising the array substrate as described in (10) or (11).

What are described above is related to the illustrative embodiments of the disclosure only and not limitative to the scope of the disclosure; the scopes of the disclosure are defined by the accompanying claims.

The invention claimed is:

1. A manufacturing method of an array substrate, comprising:

forming an underlying metal thin film on a substrate, and forming at least a gate electrode of a TFT by a mask process;

forming a gate insulating layer overlying the gate electrode;

forming a metal oxide semiconductor thin film and a top metal thin film, and performing a mask process to the metal oxide semiconductor thin film and the top metal thin film, to form a source electrode and a drain electrode of the TFT and an active layer opposing the gate electrode respectively; and forming a passivation layer overlying the source electrode and the drain electrode, and forming a contact hole at the position of the drain electrode which connects a pixel electrode, wherein during the mask process to the top metal thin film, a hydrogen peroxide-based etchant with pH value between 6-8 is used to etch the top metal thin film, wherein the step of forming a source electrode and a drain electrode of the TFT and an active layer opposing the gate electrode comprises:

forming the metal oxide semiconductor thin film and the top metal thin film sequentially;

applying photoresist to the sequentially formed two thin films, the photoresist being divided into a partially remained region, a completely remained region and a completely removed region, and according to the above divided regions, by a single exposure and development, removing photoresist in the completely removed region and having photoresist in the completely remained region remain thicker than that in the partially remained region;

etching the top metal thin film in the completely removed region with the hydrogen peroxide-based etchant;

etching the metal oxide film in the completely removed region with acid etchant that does not react with the top metal, so as to form an active layer;

ashing photoresist that is left, in order to remove photoresist in the partially remained region and have part of photoresist in the completely remained region remain; and etching the top metal thin film in the partially remained region with the hydrogen peroxide-based etchant, so as to form a source electrode and a drain electrode.

2. The manufacturing method of an array substrate according to claim 1, wherein the composition of the hydrogen peroxide-based etchant comprises: hydrogen peroxide, top metal ion complexing agent, stabilizing agent of the hydrogen peroxide, and surfactant.

3. The manufacturing method of an array substrate according to claim 2, wherein the top metal is copper or copper alloy.

4. The manufacturing method of an array substrate according to claim 3, wherein the top metal ion complexing agent is copper ion complexing agent.

5. The manufacturing method of an array substrate according to claim 2, wherein in the etchant, the content of the hydrogen peroxide is 5%-20%, the content of the surfactant is 1%-10%, and the content of the top metal ion complexing agent is 1%-25%.

6. The manufacturing method of an array substrate according to claim 2, wherein after forming the gate insulating layer and before forming the metal oxide semiconductor thin film, the method further comprises:

forming a non-metal oxide film without hydrogen, and forming a first isolation layer at the position where opposes the gate electrode by one mask process, the first isolation layer being used to prevent the gate insulating layer from contacting the active layer.

7. The manufacturing method of an array substrate according to claim 2, wherein after forming the source electrode and the drain electrode of the TFT, and before forming the passivation layer, the method further comprises:

forming a non-metal oxide film without hydrogen, and forming a second isolation layer at the position where opposes the gate electrode by one mask process, the second isolation layer being used to prevent the active layer from contacting the passivation layer.

8. The manufacturing method of an array substrate according to claim 1, wherein in the etchant, the content of the hydrogen peroxide is 5%-20%, the content of the surfactant is 1%-10%, and the content of the top metal ion complexing agent is 1%-25%.

9. The manufacturing method of an array substrate according to claim 8, wherein after forming the gate insulating layer and before forming the metal oxide semiconductor thin film, the method further comprises:

forming a non-metal oxide film without hydrogen, and forming a first isolation layer at the position where opposes the gate electrode by one mask process, the first isolation layer being used to prevent the gate insulating layer from contacting the active layer.

10. The manufacturing method of an array substrate according to claim 8, wherein after forming the source electrode and the drain electrode of the TFT, and before forming the passivation layer, the method further comprises:

forming a non-metal oxide film without hydrogen, and forming a second isolation layer at the position where opposes the gate electrode by one mask process, the second isolation layer being used to prevent the active layer from contacting the passivation layer.

11. The manufacturing method of an array substrate according to claim 1, wherein after forming the gate insulating layer and before forming the metal oxide semiconductor thin film, the method further comprises:

forming a non-metal oxide film without hydrogen, and forming a first isolation layer at the position where opposes the gate electrode by one mask process, the first isolation layer being used to prevent the gate insulating layer from contacting the active layer.

12. The manufacturing method of an array substrate according to claim 11, wherein after forming the source electrode and the drain electrode of the TFT, and before forming the passivation layer, the method further comprises:

forming a non-metal oxide film without hydrogen, and forming a second isolation layer at the position where opposes the gate electrode by one mask process, the second isolation layer being used to prevent the active layer from contacting the passivation layer.

13. The manufacturing method of an array substrate according to claim 1, wherein after forming the source electrode and the drain electrode of the TFT, and before forming the passivation layer, the method further comprises:

forming a non-metal oxide film without hydrogen, and forming a second isolation layer at the position where opposes the gate electrode by one mask process, the second isolation layer being used to prevent the active layer from contacting the passivation layer.

14. The manufacturing method of an array substrate according to claim 1, wherein the step of forming a source electrode and a drain electrode of the TFT and an active layer opposing the gate electrode comprises:

forming the metal oxide semiconductor thin film, and forming the active layer at the position where opposes the gate electrode by one mask process; and forming the top metal thin film, and forming at least the source electrode and drain electrode of the TFT by one mask process.

* * * * *